United States Patent
Akamatsu et al.

(10) Patent No.: US 6,650,017 B1
(45) Date of Patent: Nov. 18, 2003

(54) ELECTRICAL WIRING OF SEMICONDUCTOR DEVICE ENABLING INCREASE IN ELECTROMIGRATION (EM) LIFETIME

(75) Inventors: Kazuo Akamatsu, Okazaki (JP); Yoshihiko Isobe, Toyoake (JP); Hiroyuki Yamane, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/637,066

(22) Filed: Aug. 11, 2000

(30) Foreign Application Priority Data

Aug. 20, 1999 (JP) .......................... 11-234272

(51) Int. Cl.$^7$ ..................... H01L 23/48; H01L 23/52
(52) U.S. Cl. ................. 257/765; 257/758; 257/763; 257/764; 257/771
(58) Field of Search ................. 257/751, 752, 257/758, 762, 763, 764, 765, 767, 771; 438/622, 627, 688

(56) References Cited

U.S. PATENT DOCUMENTS

| | | | |
|---|---|---|---|
| 4,141,022 A | 2/1979 | Sigg et al. | 357/23 |
| 4,887,146 A | 12/1989 | Hinode | 351/71 |
| 4,989,064 A | 1/1991 | Kubokoya et al. | 357/67 |
| 5,049,975 A | 9/1991 | Ajika et al. | 357/71 |
| 5,202,579 A | 4/1993 | Fujii et al. | 257/751 |
| 5,236,869 A | 8/1993 | Takagi et al. | 437/190 |
| 5,345,108 A | 9/1994 | Kikkawa | 257/751 |
| 5,427,666 A | 6/1995 | Mueller et al. | 204/192.17 |
| 5,459,353 A | 10/1995 | Kanazawa | 257/751 |
| 5,589,713 A | 12/1996 | Lee et al. | 257/773 |
| 5,703,403 A | 12/1997 | Sobue et al. | 257/751 |
| 5,759,916 A | 6/1998 | Hsu et al. | 438/636 |
| 5,780,908 A * | 7/1998 | Sekiguchi et al. | 257/383 |
| 9,482,895 | 1/2000 | Yamaoka | |
| 6,066,891 A | 5/2000 | Yamaoka et al. | 257/751 |
| 6,099,701 A * | 8/2000 | Liu et al. | 204/192.22 |

FOREIGN PATENT DOCUMENTS

| | | |
|---|---|---|
| EP | 0430403 | 6/1991 |
| EP | 0525637 | 2/1993 |

(List continued on next page.)

OTHER PUBLICATIONS

Tsunohara, "EM Resistance When W Through Hole Is Used," *Semiconductor World*, Dec. 1995, pp. 174–179 (partial translation provided).

(List continued on next page.)

*Primary Examiner*—Tom Thomas
*Assistant Examiner*—Hung Kim Vu
(74) *Attorney, Agent, or Firm*—Posz & Bethards, PLC

(57) ABSTRACT

A method for manufacturing a semiconductor device having on a silicon substrate semiconductor elements and aluminum (Al) alloy wiring leads as electrically connected thereto is disclosed. The method includes the steps of forming on the silicon substrate an Al alloy layer containing therein copper (Cu), and forming on the Al alloy layer a titanium nitride (TiN) film with enhanced chemical reactivity by using sputtering techniques while applying thereto a DC power of 5.5 W/cm$^2$ or less. Fabrication of such reactivity-rich TiN film on the Al alloy layer results in a reaction layer of Al and Ti being subdivided into several spaced-apart segments. In this case, the reaction layer hardly serves as any diffusion path; thus, it becomes possible to prevent Cu as contained in the Al alloy layer from attempting to outdiffuse with the reaction layer being as its diffusion path. This makes it possible to suppress or minimize unwanted fabrication of AlN on or above the surface of an Al containing lead pattern, thereby enabling increase in electromigration (EM) lifetime of electrical interconnect leads used.

12 Claims, 12 Drawing Sheets

FOREIGN PATENT DOCUMENTS

| | | | |
|---|---|---|---|
| JP | 63 142832 | | 6/1988 |
| JP | 63-152147 | | 6/1988 |
| JP | 3-3395 | | 1/1991 |
| JP | 3-262127 | | 11/1991 |
| JP | 4-42537 | | 2/1992 |
| JP | 4-107954 | | 4/1992 |
| JP | 5-74961 | | 3/1993 |
| JP | 5-90268 | | 4/1993 |
| JP | 6-151815 | | 5/1994 |
| JP | 6-163877 | * | 6/1994 |
| JP | 6-275555 | | 9/1994 |
| JP | B2-2555949 | | 9/1996 |
| JP | 10-98041 | | 4/1998 |
| JP | 10-106972 | | 4/1998 |
| JP | 11-354519 | | 12/1999 |

OTHER PUBLICATIONS

Koyama, "EM Securing Method in AL Wiring Limiting Evaluation," pp.98–111 (partial translation provided). No Date.

Wendt et al., "Process Integration for Barrier Layers and AL–Alloys Using a Sputtering Cluster Tool," *Proceedings of the 22$^{nd}$ European Solid State Device Research Conference/Microelectronic Engineer*, Sep. 14, 1992, pp. 371–374.

Ting, "New Structure For Contact Metallurgy," *IBM Technical Disclosure Bulletin*,vol. 25, No. 12, May 1983, pp. 6398–6399.

Jin et al. , "Bias Effect on the Microstructure and Diffusion Barrier Capability of Sputtered TiN and TiOxNy Films," *Japanese Journal of Applied Physics Part 1, Regular Papers, Short Notes& Review*,May 1992, No. 5A, pp. 1446–1452.

Koubuchi et al., Effects of Si on Electromigration of AL–Cu–Si/TiN Layered Metallization,*J. Vac. Sci. Technol. B*, vol. 10, No. 1, Jan./Feb. 1992, pp. 143–148.

Kikkawa, "A Quarter–Micrometer Interconnection Technology Using a TiN/AL–Si–Cu/TiN/AL–Si–Cu/TiN/Ti Multilayer Structure," *IEEE Transactions on Electron Devices*, vol.40, No. 2, Feb. 1993, pp. 296–302.

Mandl et al., "Diffusion Barrier Properties of Ti/TiN Investigated By Transmission Electron Microscopy," *J. Appl. Phys.*, vol. 68, No. 5, Sep. 1990, pp. 2127–2132.

Sobue et al., "Metastable Phase Formation in AL Alloy/TiN/Ti/Si Systems," *First International Symposium on Control of Semiconductor Interfaces*, Nov. 1993, pp. 1–6.

Pramanik et al., "Barrier Metal for ULSI —Its Manufacturing Process and Reliability," *Solid State Technology*, Jul. 1991, p. 27 (partial translation provided).

Freiberger et al., "A Novel Via Failure Mechanism in an AL–Cu/Ti Double Level Metal System," *IEEE/IRPS*, Jan. 1992, pp. 356–360.

Gardner et al., "Mechanical Stress as a Function of Temperature for Aluminum Alloy Films," *J. Appl. Phys.*, vol. 67, No.4, Feb. 1990, pp. 1831–1844.

Nicolet et al., "Diffusion Barriers in Layered Contact Structures," *J. Vac. Sci. Technol.*, vol. 19, No. 3, Sep./Oct. 1981, pp. 786–793.

Iwabuchi et al., "A Highly Relaible Pure AL Metallization with Low Contact Resistance Utilizing Oxygen–Stuffed TiN Barrier Layer," *1986 Symposium on VLSI Technology— Digest of Technical Papers*, May 1986, pp. 55–56.

Sinke et al., "Oxygen in Titanium Nitride Diffusion Barriers," *Appl. Phys. Lett.*, vol. 47, No. 5, Sep. 1985, pp.471–473.

* cited by examiner

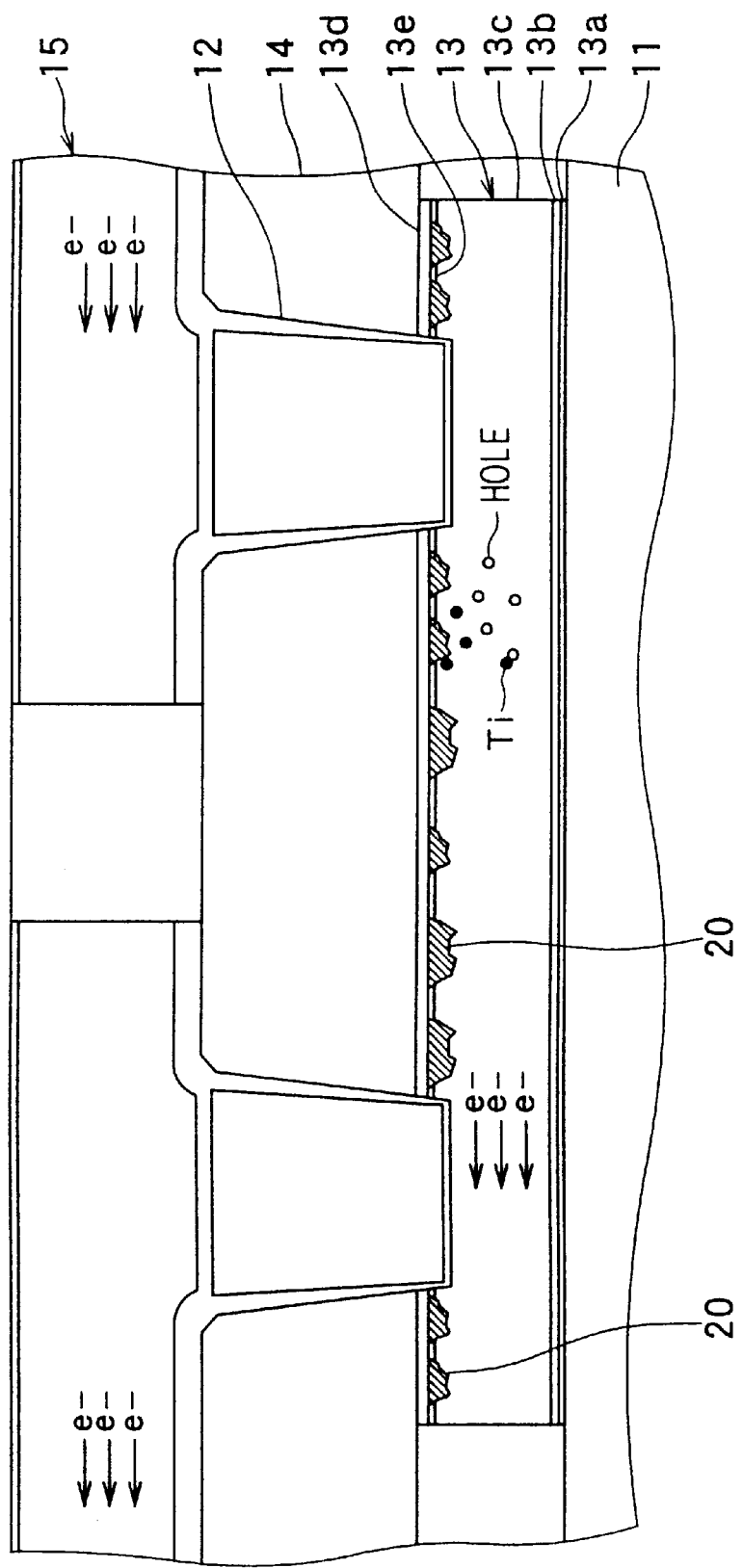

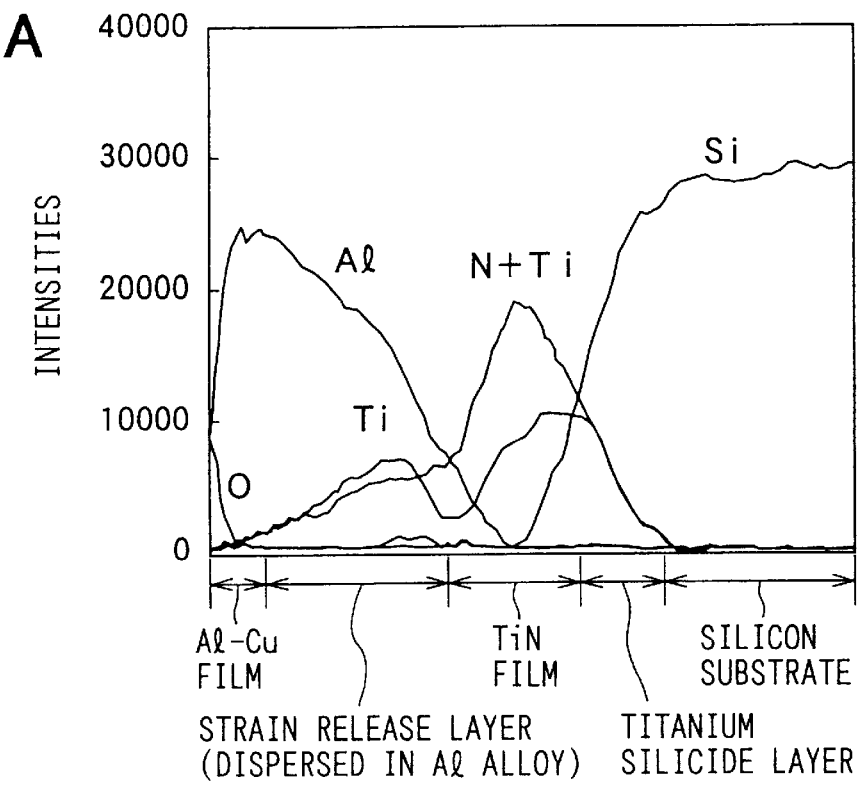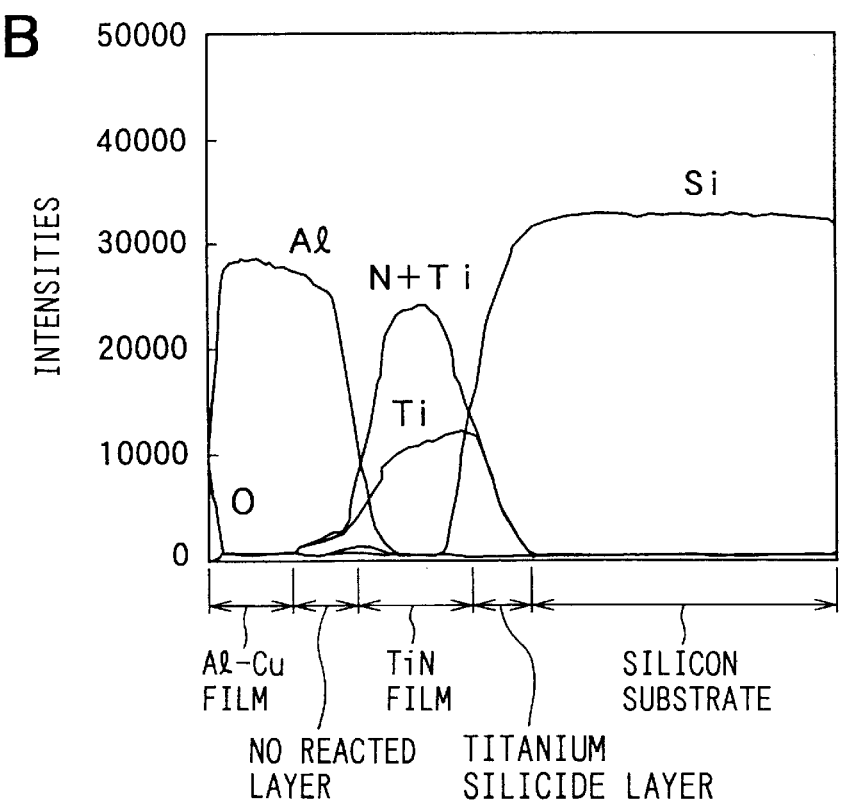

ELECTRICAL WIRING OF SEMICONDUCTOR DEVICE ENABLING INCREASE IN ELECTROMIGRATION (EM) LIFETIME

CROSS REFERENCE TO RELATED APPLICATION

This application is based upon Japanese Patent Application No. Hei. 11-234272 filed on Aug. 20, 1999, the contents of which are incorporated herein by reference.

BACKGROUND OF THE INVENTION

1. Field of the Invention

The present invention generally relates to semiconductor devices with electrical interconnect leads and manufacturing methods of the same. More particularly, the invention relates to electrical wiring leads with a lead pattern comprised of an aluminum (Al) wiring layer and interlevel via holes as filled with certain materials less in self-diffusion coefficient than Al, such as tungsten (W) or else.

2. Related Art

In recent years, as semiconductor integrated circuit (IC) products increase in functionalities and operation speeds required, microfabrication and multilayer lamination architectures are becoming more important in the manufacture of semiconductor IC devices. To fabricate highly integrated semiconductor IC chips with a minimum feature size of 0.5 micrometers ($\mu$m) or less, multilevel interconnect lead wires made of aluminum (Al) alloys are typically employed while tungsten (W) is used as wire material as hole portions.

Highly integrated IC chips with use of such electrical wire materials are faced with risks of reduction in electromigration (EM) lifetime. The EM lifetime reduction can often occur due to the so-called Kirkendall effect, which takes place upon usage in combination of certain materials with an increased difference in self-diffusion coefficient therebetween. The EM lifetime reduction is a serious bar to achieve higher reliability of wire material.

One typical prior known approach to preventing excessive decrease in lead pattern width—i.e. pattern thinning—otherwise occurring due to surface reflection of an Al alloy during fabrication of Al-alloy wiring leads by photolithographic patterning techniques is to employ a device structure with an antireflection film made of a lamination of titanium nitride (TiN) and titanium (Ti) disposed on a lead pattern surface. Unfortunately this approach suffers from a problem as to the EM lifetime reduction. This can be said because, as known among those skilled in the semiconductor art, a chemical reaction layer of Al and Ti (such as $TiAl_3$, film or the like) could be formed on such lead pattern surface, which layer badly serves as a route or path that causes accelerated outdiffusion of copper (Cu) as has been doped into the Al-alloy layer. The creation of such Cu diffusion path undesirably hasten reduction in EM lifetime due to the Kirkendall effect. In order to lower the drift speed of Al used for the lead pattern, let the Al-based leads contain Cu inherently less in drift speed to thereby eliminate generation of voids due to Al diffusion. Here, Cu is outdiffused with the reaction layer ($TiAl_3$ or else) being as its diffusion path, resulting in a decrease in Al-drift suppression effects. This Al-drift suppression in turn causes the EM lifetime reduction stated supra.

To improve the EM lifetime of on-chip interconnect leads, the following discussion was made.

It has been stated that formation of the reaction layer ($TiAl_3$ or else) is considered to be formed mainly due to the presence and behavior of Ti in the antireflection film. In light of this, consideration was given to reducing the thickness of a Ti thin-film of the TiN/Ti antireflection film which is widely employable as the currently available antireflection film structure while subdividing the reaction layer serving as the Cu diffusion path into several spaced-apart portions or "segments" However, this approach results in that any expected reaction layer segmentation effect does not come without accompanying a limit in Ti film thickness setting—that is, such segmentation is attainable only when letting the Ti film measure 5 nanometers (nm) or less. This undesirably requires the use of special thin-film fabrication apparatus or equipment with difficulties in achieving accurate film thickness control procedures.

Another method was also studied for excluding or "depleting" Ti of such antireflection film to provide a single-layered TiN layer structure. Unfortunately, this approach results in creation of a problem that the via-hole resistivity increases rather than decreases. Such via-hole resistance reduction is due to formation of an aluminum nitride (AlN) dielectric layer at the interface between TiN and Al films. More specifically this would take place due to occurrence of electrical interconnect defects between W and Al within via holes as resulted from AlN formation and/or via-hole fabrication failures occurring due to the fact that AlN acts as an etch stopper during fabrication of via holes. Although additional experimentation was conducted with respect to certain single-layered wiring leads employing similar structures, this also resulted in a significant decrease in EM lifetime.

To investigate the cause of such results, consideration was given to the process for fabrication of the TiN layer. See FIG. 16, which depicts one process step of forming such TiN film.

As shown in FIG. 16, the TiN film 50 is manufactured through sputtering using a Ti target 51 in the atmosphere of a mixture of nitrogen ($N_2$) and argon (Ar) gases. At this time, inclusion of $N_2$ in the sputtering atmosphere would result in production of nitrogen radicals in a reactive sputtering plasma. These nitrogen radicals behave to nitride the surface of an Al pattern 52, which leads to formation of a dielectric layer of AlN. This suggests that avoiding formation of such dielectric AlN layer may lead in principle to improvement in EM lifetime.

Additionally, one prior known technique for suppressing such AlN. formation is disclosed, for example, in Japanese Patent Laid-Open No. Hei. 7-99193. The technique as taught by this Japanese document is such that a TiN film is formed on the surface of an Al lead pattern at low temperatures of 150° C. or less to thereby decrease the chemical reactivity of residual nitrogen radicals created in a plasma with respect to Al, which in turn suppresses fabrication of an AlN layer. Regrettably, this technique remains deficient in AlN formation suppressibility. Another problem faced with the technique is that Ti becomes harder in diffusion into Al material. This can be said because the TiN film being formed on the Al pattern surface is typically made of a chosen material that is high in diffusion block or "barrier" performance. This makes it impossible or at least greatly difficult to obtain the intended effect of lowering an interface energy between TiN and Al due to Ti diffusion—this is inherently expected owing to insertion of the Ti film between Al and TiN films—and the effect of enabling successful fulfillment of voids or holes within Al materials by means of Ti diffusion.

SUMMARY OF THE INVENTION

The present invention has been made in view of the above-noted technical background, and its object is to suppress formation of an AlN layer overlying the surface of an Al containing lead pattern of a semiconductor device to thereby increase the EM lifetime of electrical interconnect leads used therein.

In order to attain the foregoing object, in accordance with a first aspect of the invention, a method of manufacturing a semiconductor device including on a semiconductor substrate semiconductor elements and Al alloy wiring leads as electrically connected to such elements is provided, which method includes the steps of forming on or over the semiconductor substrate an Al alloy layer that contains therein a chosen metal with increased Al migration suppressibilities and then forming over the Al alloy layer a TiN film with increased chemical reactivity through sputtering processes while a direct current (DC) power of 5.5 watts per square centimeter (W/cm$^2$) or less is applied thereto.

The use of such reactivity-rich TiN film overlying the Al alloy layer makes it possible to subdivide a reactive layer of Al and Ti into several spaced-apart segments. Whereby, the reactive layer will no longer serve as any diffusion path, which makes it possible to preclude any metals such as Cu for use in suppressing movement or migration of Al contained in the Al alloy layer from diffusing with the reactive layer being as its diffusion path.

In accordance with a second aspect of the invention as disclosed herein, a semiconductor device manufacturing method is provided including the steps of forming an Al alloy layer on or above a semiconductor substrate, and forming a TiN film over the Al alloy layer through sputtering with TiN being as a target and also with no N$_2$ gases introduced into the atmosphere concerned.

With effectuation of the sputtering process precluding introduction of N$_2$ gases into the atmosphere with the TiN being as a target, it becomes possible to fabricate the intended TiN film on or over the Al alloy layer without suffering from creation of nitrogen radicals. This makes it possible to prevent or at least greatly suppress unwanted fabrication of AlN otherwise occurring due to chemical reaction of such nitrogen radicals with Al involved. Another advantage of the invention lies in an ability to attain an anti-reflection film structure constituted from a single film of a chosen material such as TiN, which in turn makes it possible to avoid the problem faced with the related art due to formation of a reflective layer made of Ti in prior known TiN/Ti antireflection film structures, which layer could serve as a diffusion path that—is, the risk of outdiffusion of a metal contained in the Al alloy layer for use in suppressing Al migration, such as Cu or the like, with the reaction layer being as its diffusion path.

In accordance with a third aspect of the invention, in cases where a TiN film as formed on or over the surface of a Ti target is aimed as a target, sputtering is carried out in a way such that introduction of N$_2$ gases into the atmosphere is eliminated while permitting introduction of N$_2$ gases thereinto after spin-out removal of TiN components on the Ti target surface. With such an arrangement, upon startup of the sputtering treatment, sputtering is done with the TiN film formed on the Ti target surface being as a target, which makes it possible to fabricate the intended TiN film without formation of AlN on the Al alloy layer surface while at the same time enabling establishment of any desired thickness of the resultant TiN film because of the fact that the sputtering will thereafter be replaced with reactive sputtering with Ti being as the target.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

FIG. 2 is a partial enlarged sectional view of certain part of the semiconductor device shown in FIG. 1, which is adjacent to an electrical wiring lead 13 thereof;

FIG 7A is a graph showing a micro-Auger depth profile obtained when the reactivity-rich TiN film 13$d$ is employed;

FIG 7B is a graph showing a micro-Auger depth profile obtained when the high barrier-performance TiN film is employed;

DESCRIPTION OF THE PREFERRED EMBODIMENTS

First Embodiment

Figure 1:
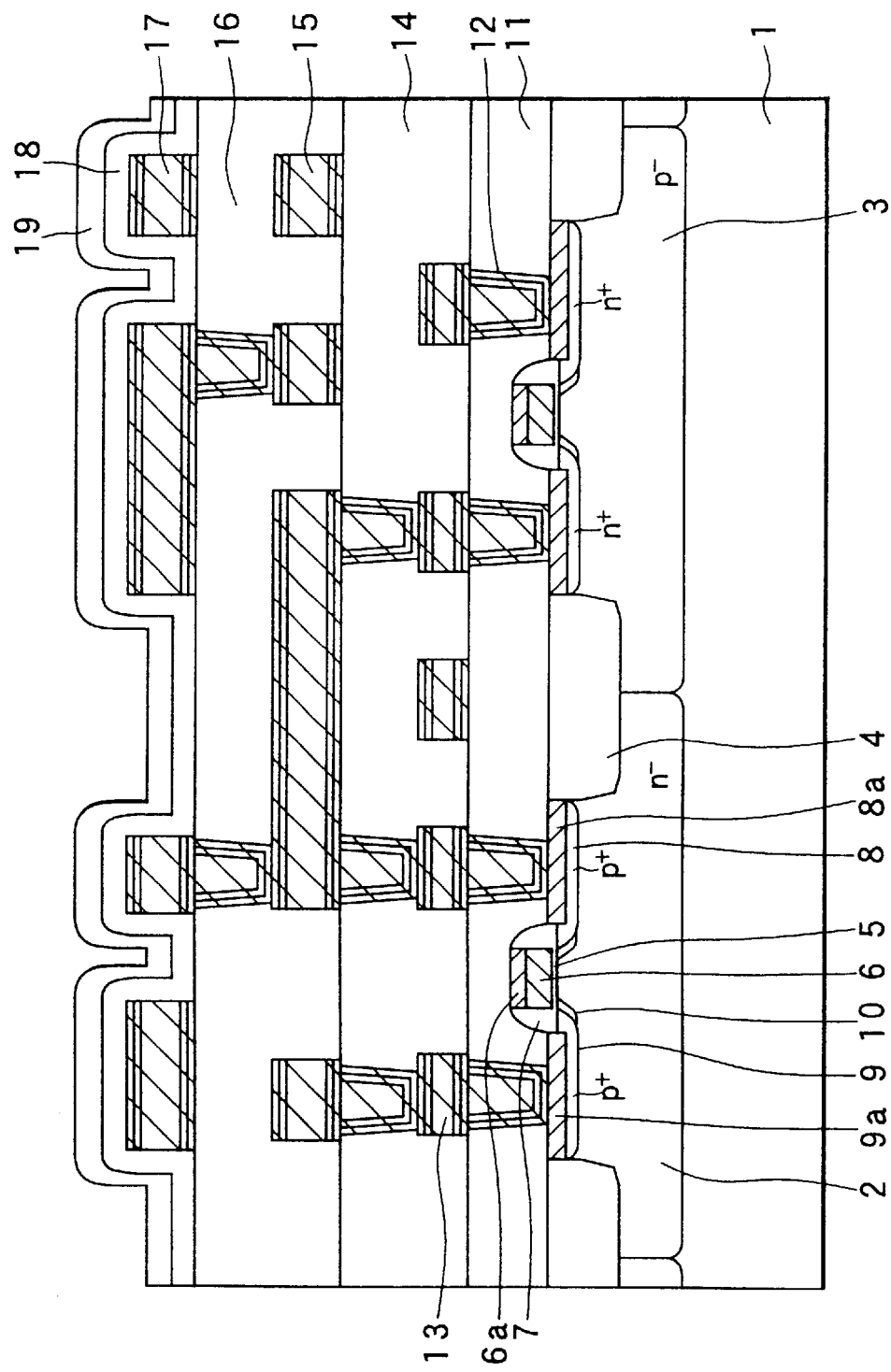
FIG 1 is a sectional view illustrating an overall structure of a semiconductor device fabricated by a manufacturing method in accordance with a first embodiment of the present invention.

Referring to FIG. 1, there is shown a complementary metal oxide semiconductor (CMOS) transistor with a self-aligned silicide or "salicide" structure as an example of the semiconductor device in accordance with one preferred embodiment of the present invention.

The CMOS transistor structure shown herein includes a silicon substrate 1 of a selected conductivity type—here, p-type—having its top surface in which a lightly doped n ($n^{31}$)-type semiconductor well region 2 and $p^{31}$-type well region 3 are formed. The CMOS structure is generally structured from a P-type MOS (PMOS) transistor and an N-type MOS (NMOS) transistor, wherein the former is in the $n^{31}$-type well region 2 whereas the latter is in $p^{31}$-type well region 3. These PMOS and NMOS transistors are electrically isolated from each other by an element separation layer 4 formed of a shallow trench isolation (STI) film, which is formed in the surface of silicon substrate 1 at a boundary of $n^{31}$ and $p^{31}$-type well regions 2, 3. In view of the fact that the PMOS and NMOS transistors are similar in principal structure to each other with the conductivity types being different from each other, only the structure of PMOS transistor will be set forth in detail below.

As shown in FIG. 1, the PMOS transistor includes a gate electrode 6 that is insulatively formed over the $n^-$-type well region 2 with a gate oxide film 5 sandwiched therebetween. This gate electrode 6 has opposite side walls on which oxide films 7 are formed. The sidewall oxide films 7 are self-aligned with spaced-apart heavily-doped p ($p^+$) type semiconductor diffusion layers 8, 9 as formed in the $n^-$-type well region 2 in silicon substrate 1 for use as source and drain, with a substrate surface portion between these source/drain diffusions 8, 9 being as a channel region. The source/drain diffusions 8, 9 have terminate ends far from the gate electrode 6, which are in contact with the STI films 4 for electrical isolation of elements involved. Additionally the PMOS transistor comes with a couple of p-type layers 10 which are at inside ends of source/drain diffusions 8, 9—namely at the opposite sides of the channel region. The p-type layers 10 are for use as electric field relax layers.

The gate electrode 6 is associated with a silicide film 6a as formed on the top surface thereof. Similarly the source/drain diffusions 8, 9 have silicide films 8a, 9a formed thereon. These silicide films 6a, 8a and 9a are for use as electrical contacts. Whereby, the PMOS transistor with the salicide structure is thus arranged.

As shown in FIG. 1 an interlayer dielectric (ILD) film 11 is formed by interlevel dielectric deposition techniques over the silicon substrate 1 including the PMOS/NMOS transistors. The ILD film 11 may be a boron phosphorus silicate glass (BPSG) film or a tetra-ethyl-ortho-silicate (TEOS) film or the like. The ILD layer 11 has contact holes filled with plugs 12 made of tungsten (W), through which plugs the source/drain diffusions 8, 9 are electrically connected to a first-level wiring layer 13 made of an aluminum (Al) alloy.

The first-level Al-alloy wiring layer 13 is designed to have a multilayer structure. One exemplary structure of Al-alloy wiring layer 13 is shown in FIG. 2, which depicts an enlarged sectional device structure different from that shown in FIG. 1. Arrows are used herein to indicate a flow of electrons ("e"). As apparent from viewing FIG. 2, the first Al-alloy wiring layer 13 consists essentially of a lamination of multiple films: a titanium (Ti) film 13a with a thickness of approximately 20 nanometers (nm), titanium nitride (TiN) film 13b with a thickness of about 30 nm, aluminum-copper (Al—Cu) film 13c having a thickness ranging from about 450 to 900 nm, and TiN film 13d with a thickness of about 30 to 40 nm. These films 13a–13d are laminated in the order in which they are stated herein, with a width of about 0.4 to 0.6 micrometers ($\mu$m). The Al—Cu film 13c is typically made of Al with Cu contained therein at 0.5 weight percent (wt %).

As shown in FIG. 2 the first-level Al-alloy wiring layer 13 further includes an aluminum nitride (AlN) film 13e lying between the Al—Cu film 13c and TiN film 13d. Very importantly this AlN film 13e is less in thickness than that in the related art. In addition, an array of spaced-apart chemical reactive layer components or "islands" 20 is distributed so that the array extends from TiN film 13d toward Al—Cu film 13c. The island-like reaction layer 20 may be made of $TiAl_3$ or other similar suitable materials. Unlike prior known TiN/Ti antireflection film structures employing a continuous or "integral" reaction layer, the use of discontinuous island-like distribution or "segmentation" of the thin reaction layer 20 makes it possible to prevent such layer 20 from serving as any Cu-diffusion path. This inturn makes it possible to successfully suppress or minimize any possible Al drift, thus enabling improvement in resultant electromigration (EM) lifetime.

As better shown in FIG. 1, a second-level Al-alloy wiring layer 15 overlies the first-level Al-alloy wiring layer 13 with an ILD film 14 sandwiched therebetween. The ILD film 14 may be a TEOS oxide film or else. Further formed over the second Al-alloy wiring layer 15 is a third-level Al-alloy wiring layer 17 with an ILD film 16 made of TEOS oxide or the like being laid between them. These second and third Al-alloy wiring layers 15, 17 are similar in structure to the first Al-alloy layer 13 discussed previously.

The third Al-alloy wiring layer 17 has its surface that is covered or coated with a protective film which is comprised of a lamination of P-TEOS film 18 and P-SiN film 19 as shown in FIG. 1. The CMOS transistor structure embodying the invention is arranged in the way stated above.

A process of manufacturing the CMOS transistor device shown in FIGS. 3A–5C will be described with reference to FIGS. 3A–3C, 4A–4C and 5A–5C below. These diagrams illustrate, in cross-section, some of the major process steps in the manufacture of the CMOS transistor device.

Figure 3A:
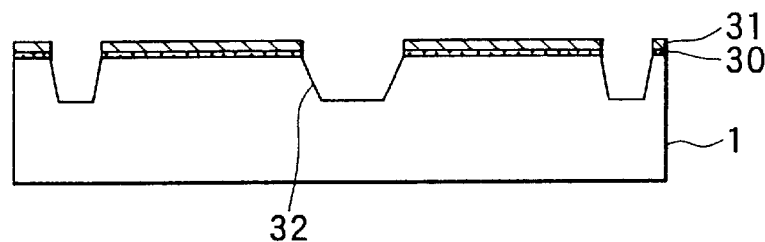
FIGS. 3A to 3C 4A–4C and 5A–5C are sectional views illustrating manufacturing steps of the semiconductor device of FIG.1.

Step Shown in FIG. 3A

Firstly, as shown in FIG. 3A, a semiconductor substrate 1—here, silicon (Si) substrate—of p type conductivity is prepared. Then, a thermal oxide film 30 made of $SiO_2$ or else is fabricated on the top surface of Si substrate 1; further, a silicon nitride (SiN) film 31 is formed on thermal oxide film 30. And, through photolithography process, the $SiO_2$ film 30 and SiN film 31 are patterned to have openings or via-holes at their selected portions overlying specified regions in which the STI film portions 4 (see FIG. 1) will later be formed. Thereafter, etching is conducted to the Si substrate 1 so that its corresponding surface portions of a predetermined depth are removed away to thereby pattern trench-like grooves 32 for electrical element isolation. At this time, appropriate process control is done to permit these trenches 32 to have a depth of about 0.3 to 0.6 $\mu$m to ensure that the intended element isolation is established at element sections.

Figure 3B:
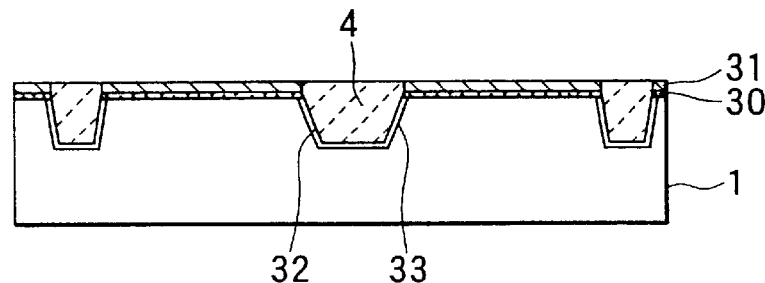

Step Shown in FIG. 3B

Then, as shown in FIG. 3B, thermal oxidation is effectuated causing a thermal oxide film 33 to be fabricated on an inner wall of each trench 32 while at the same time letting trench 32 be rounded in inside profile. Thereafter, a TEOS film 34 is deposited on the overall surface of the Si substrate 1 there by letting trench 32 be filled with the TEOS film. Preferably the TEOS film 34 may be HTO-TEOS, LP-TEOS, $O_3$-TEOS or other similar suitable materials.

Next, let the resulting TEOS film be subjected to chemical-mechanical polishing (CMP) treatment with the SiN film 31 being used as a stopper, for planarization of the entire surface thereof. Whereby, TEOS film portions reside only within the trenches 32; the STI film 4 is thus formed in the individual one of trenches 32 in Si substrate 1.

Figure 3C:
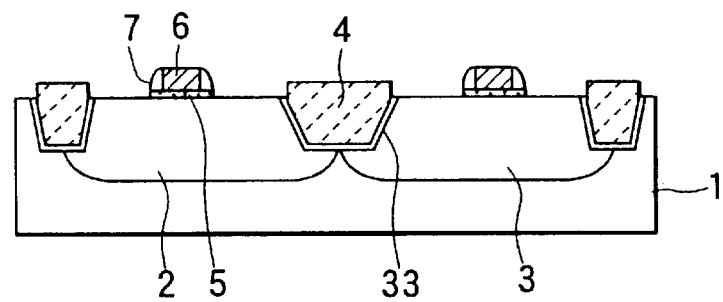

Step Shown in FIG. 3C

Then, as shown in FIG. 3C, after having removed the SiN film 31 away from Si substrate 1, an n⁻-type well region 2 is formed through a photoresist process in the surface of Si substrate 1 at selected part corresponding to a specified region in which the PMOS transistor will be formed at a later process step. Thereafter, through photolithography process again, a p⁻-type well region 3 is formed therein at another part corresponding to a specified region in which the NMOS transistor will later be formed.

The $SiO_2$ film 30 is then removed by known wet etch techniques. Then, sacrificial oxidation or the like is done while simultaneously performing drive-in treatment to thereby improve the surface conditions of resultant n⁻-type well region 2 and p⁻-type well region 3. Thereafter, a gate oxide film 5 is fabricated by thermal oxidation techniques.

Then, a polycrystalline silicon or "polysilicon" film is formed on the gate oxide film 5 to a predetermined thickness of about 0.35 μm, or more or less. And, through photolithography process, a patterned gate electrode 6 is fabricated on gate oxide film 5.

Next, an electrically insulation or dielectric film is deposited on the entire surface of Si wafer by chemical vapor deposition (CVD) techniques. This dielectric film is then subjected to etch-back processing using anisotropic etch techniques including reactive ion etching (RIE) methodology, thus forming sidewall films 7 on the opposite sidewalls of gate electrode 6.

Figure 4A:
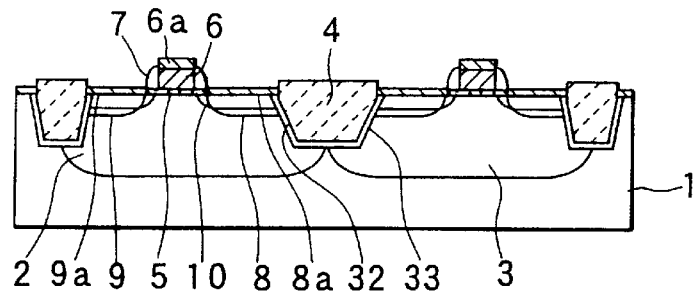

Step Shown in FIG. 4A

Thereafter, as shown in FIG. 4A, the so-called "through" film is fabricated by thermal oxidation, which film is for use during ion implantation processes. After fabrication of this film, the Si substrate 1 is coated with a photoresist film in the NMOS transistor later-formation region and NMOS transistor later-formation region thereof in this order of sequence. The PMOS transistor later-formation region is doped with a chosen impurity of p-type conductivity (boron, for example) in a direction at an angle to the substrate surface whereas the NMOS transistor later-formation region is obliquely doped with n-type impurity (e.g. phosphorus). Such oblique ion-implantation of p- and n-type impurities is done with the gate electrode 6 and its associated sidewall films 7 being used as a mask therefor, which results in fabrication of electric field relaxation layers 10 on the opposite sides of gate electrode 6. These electric field relax layers 10 are placed at locations in close proximity to inside of gate electrode 6 and are substantially self-aligned with the overlying gate sidewall films 7 as shown in FIG. 4A.

Further, the NMOS transistor later-formation region and PMOS transistor later-formation region of Si substrate 1 are sequentially coated with photoresist films in this order. A chosen p-type impurity (e.g. boron) is heavily doped into the PMOS transistor later-formation region to an increased concentration in a direction at right angles to the substrate surface; an n-type impurity (e.g. arsenide) is heavily doped into the NMOS transistor later-formation region in the perpendicular direction to the substrate surface. Such perpendicular ion-implantation of p- and n-type impurities is carried out with the gate electrode 6 and sidewall films 7 being used as a mask, thereby fabricating spaced-part source/drain layers 8, 9 in Si substrate 1 on the opposite sides of gate electrode 6. Thus, the intended lightly doped drain (LDD) gate structure is completed.

After having removed the "through" film, the resultant device structure is subject to titanium silicidation in a way which follows. A titanium (Ti) film and titanium nitride (TiN) film are sequentially fabricated on the entire wafer surface. Then, perform rapid thermal appealing (RTA) in argon (Ar) gaseous atmosphere causing reaction for silicidation. Next, form titanium silicide (TiSi) films 6a, 8a and 9a on resultant exposed surfaces of the LDD gate electrode 6 and source/drain diffusions 8, 9, respectively.

Note here that the thermal processing for silicidation is done at relatively low temperatures less than or equal to 700° C. This low temperature setup is for suppression of excessive upward growth or "rise-up" of silicide to the sidewall films 7 and for prevention of unwanted reaction of sidewall films 4 with Si plus for minimization of undesired change-in-quality or "transformation" of $TiSi_2$ from C49 into C54 phase.

Then, perform selective etching using a fluidal mixture of ammonia and hydrogen peroxide water to thereby remove those portions of the Ti and TiN films which are free from silicidation reaction. After completion of such selective etching, only the TiSi films 6a, 8a and 9a remain. The salicide structure is thus completed.

Thereafter, let the TiSi films 6a, 8a and 9a again undergo RTA treatment (second RTA process) at a temperature of about 850° C. for reduction of electrical resistivity thereof.

Figure 4B:
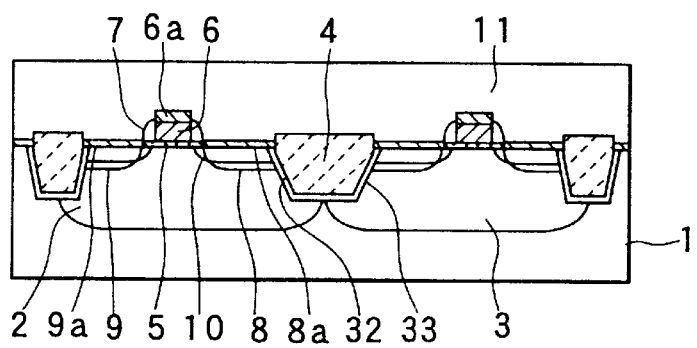

Step Shown in FIG. 4B

Subsequently, as shown in FIG. 4B, a dielectric film 11 such as BPSG or TEOS film or else is deposited on the entire wafer surface, followed by planarization of the dielectric film 11 by CMP techniques.

Figure 4C:
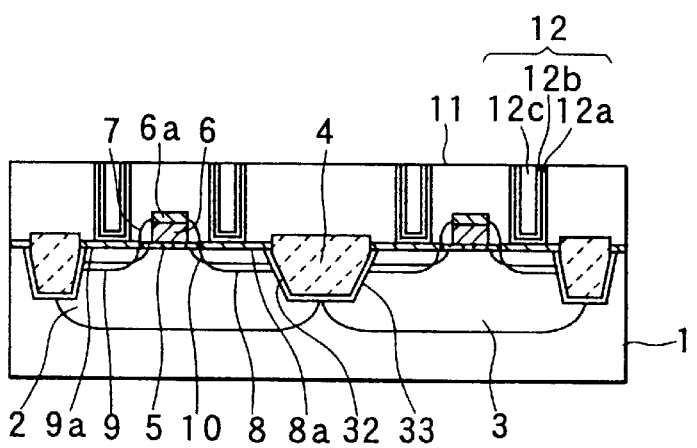

Step Shown in FIG. 4C

Then, as shown in FIG. 4C, contact holes are photolithographically formed in the dielectric film 11. And a Ti film 12a and TiN film 12b are sequentially laminated within a respective one of the contact holes, which films are for use as a bond layer and a barrier metal. Further buried in each contact hole is a tungsten (W) layer 12c, which is stacked on the barrier metals 12a and 12b. Whereby, each contact hole is filled with a lamination of barrier metals 12a and 12b and W layer 12c.

Thereafter, the barrier metals 12a and 12b and W layer 12c are subject to etch-back treatment causing these components 12a and 12c to reside only within contact holes. This results in fabrication of W plugs 12 with electrical connection to the source/drain diffusions 8, 9 and others.

Figure 5A:
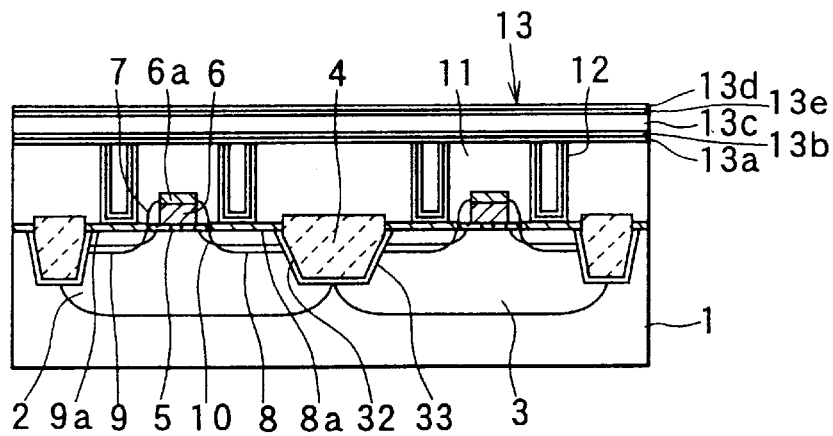

Step Shown in FIG. 5A

As shown in FIG. 5A, for fabrication of first-level Al-alloy wiring leads 13, a multilayered metallic film is formed on the entire wafer surface. This metal film includes a Ti film 13a having a thickness of about 30 nm, a TiN film 13b with a thickness of about 20 nm, and an Al—Cu film 13c with a thickness ranging from about 450 to 900 nm, these films 13a–13c being sequentially laminated over each other in this order.

Subsequently, a TiN film 13d is formed by sputtering techniques on the Al—Cu film 13c to a thickness of about 30 to 40 nm. At this time, $N_2$-added reactive sputtering is carried out while controlling the DC power so that it stays at or less than about 5.5 W/cm². Other chamber conditions during the sputtering are as follows: Temperature is less than or equal to about 180° C., pressure is at about 5.5 mTorr, Ar gas flow rate is set at about 90 sccm, and $N_2$ gas flow rate is about 90 sccm.

With the DC power potentially lowered to less than the specified value during reactive sputtering, it is possible to fabricate the intended TiN film 13d with increased chemical reactivity—say, "reactivity-rich" TiN film. While at this step an AlN layer 13e can be formed at an interface between the TiN film 13d and Al—Cu film 13c, such layer 13e stays less in thickness as will be discussed in detail later in the description.

Figure 6:
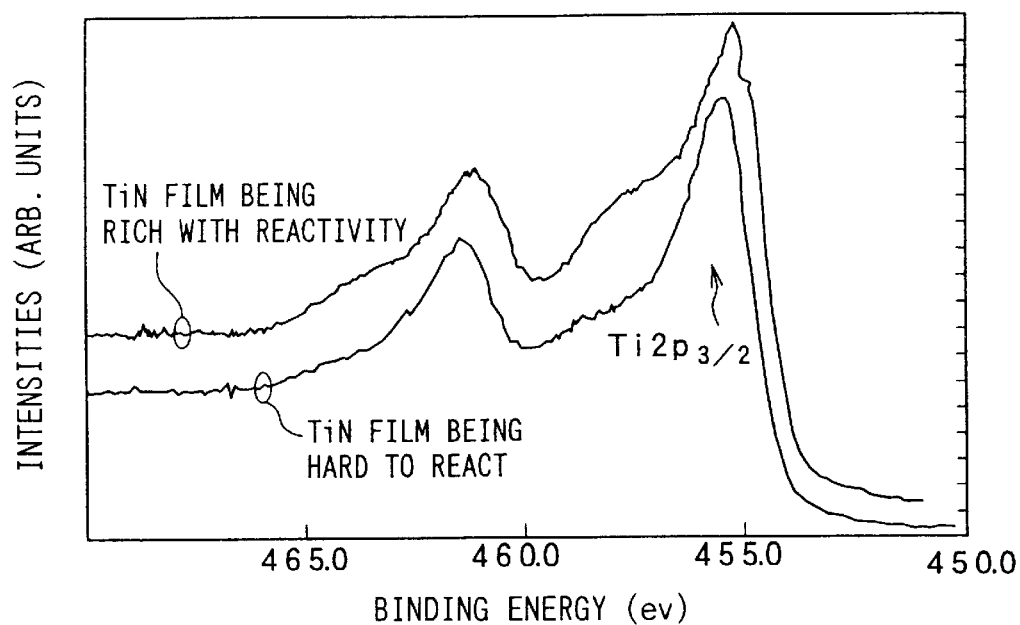
FIG 6 is a graph showing characteristics of a TiN film 13$d$ with increased chemical reactivity in accordance with the first embodiment in comparison with one typical TiN film of the related art that is high in barrier performance.

Here, for purposes of facilitation of understanding of the invention, reference is made to FIG. 6. This diagram is a graph showing a characteristic of the reactivity-rich TiN film 13d as fabricated by the manufacturing method embodying the invention in comparison with that of one typical prior known TiN film that is less in chemical reactivity and high in diffusion block or "barrier" performance. This graph shows experimentation results of samples or specimens prepared—one is for the embodiment, and the other is for the related art—each of which includes a TiN film alone, and plots therein several values of constraint or bound energy shift amounts of those electrons staying at the Ti2P3/2 level of Ti atoms of such TiN film due to chemical linkage with nitrogen (N), as measured by X-ray photoelectron spectroscopy (XPS) method. As apparent from viewing this graph, a barrier-rich/reactivity-poor TiN film of the related art measures 1.51 electron volts (eV) in chemical shift at TiP3/2 level whereas the reactivity-rich TiN film 13d of the embodiment is as low as 1.32 eV. This suggests that the coupling or bond state between N and Ti is weak, which renders Ti of TiN readily outdiffuseable into Al alloy.

Also see graphs shown in FIGS. 7A and 7B, wherein the former demonstrates a micro-Auger depth profile of the reactivity-rich TiN film 13d formed on the Al—Cu film 13c as in the embodiment whereas the latter indicates that of the high barrier-performance TiN film of the related art. For purposes of convenience in discussion herein, the measurement values as plotted in these graphs are mainly resulted from observation of chemical reaction at an interface between Al and TiN films which are included in a three-layered lamination structure including Al and TiN plus Ti films over a Si substrate. Similar phenomenon would take place on the side of an antireflection film used.

Figure 8:
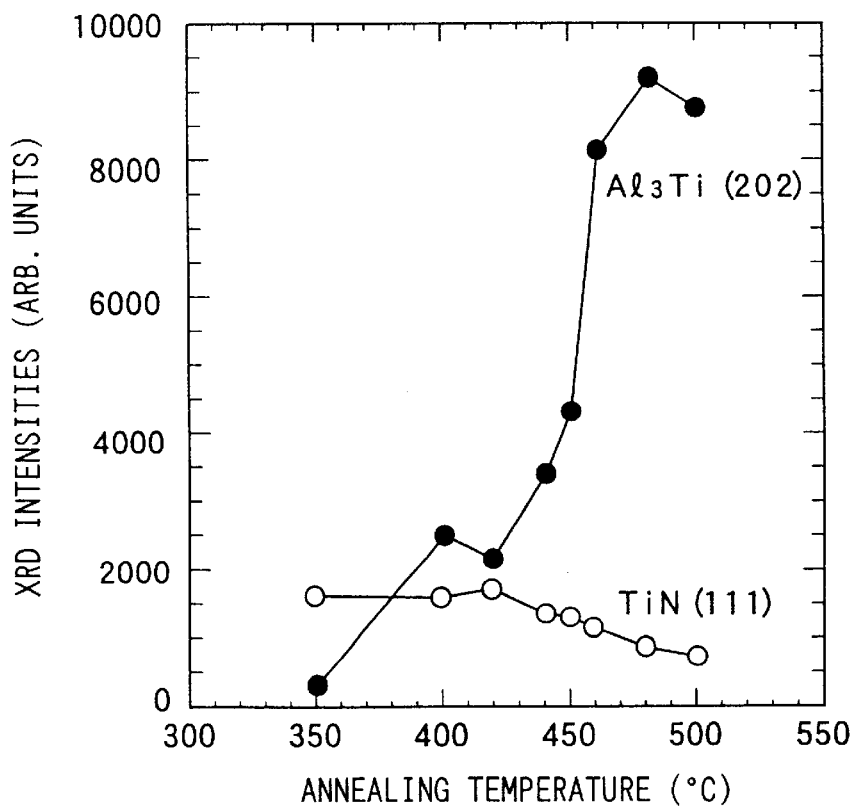
FIG. 8 is a graph demonstrating an experimentation result of X-ray diffraction (XRD) analysis on a layer of Ti—Al alloy.

As apparent from this diagram, the reactivity-rich TiN film 13d is such that Ti has diffused outwardly or "outdiffused" from the TiN film into the Al—Cu film 13c. And such outdiffused Ti behaves to react with Al resulting in fabrication of a reaction layer 20 that is made of a Ti—Al alloy. X-ray diffraction (XRD) analysis on this reaction layer 20 revealed the fact that it consists essentially of TiAl$_3$ as shown in FIG. 8.

The reaction layer 20 thus fabricated functions as a strain relaxation layer for enabling reduction of the interface energy between TiN and Al alloy.

Furthermore, the reactivity-rich TiN film 13d with enhanced chemical reactivity is such that Ti behaves to outdiffuse into the Al—Cu layer 13c to thereby fulfill any residual voids or holes within Al—Cu layer 13c. This makes it possible to improve the EM lifetime along with stress migration lifetime while simultaneously enabling electrical interconnect lead wires to increase in reliability.

An explanation will now be given of the reason why the DC power during sputtering is set at the specific value stated supra and also the reason why the remaining process conditions are set at the specific values stated previously.

Figure 9:
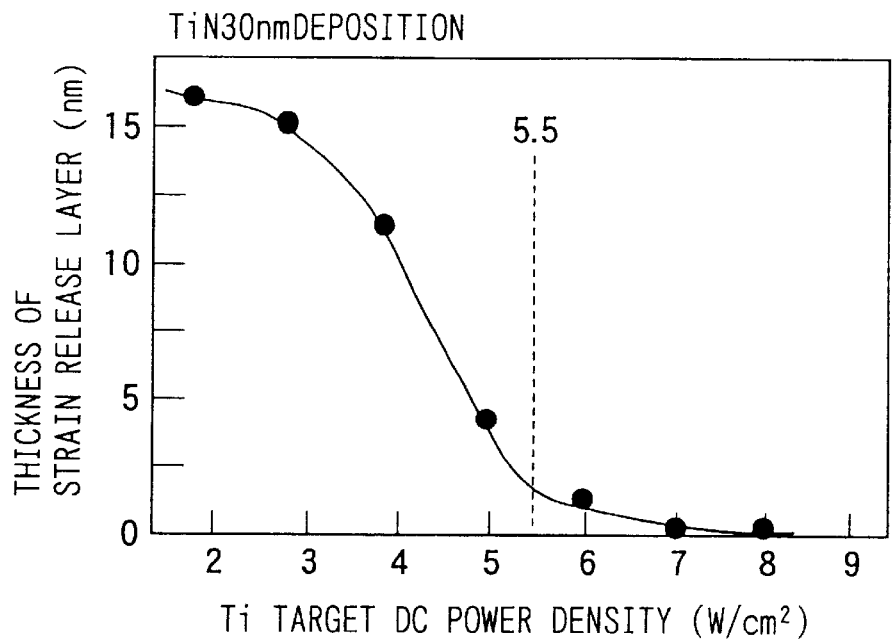
FIG. 9 is a graph showing a relation of a DC power density versus a thickness of a reactive film 20 during sputtering.

See first FIG. 9. This graph shows a relation of a DC power density during sputtering with a Ti film being as a target versus a film thickness of the reaction layer 20 as formed within Al—Cu film 13c shown in FIG. 5A. This graph well demonstrates that the reaction layer 20 steeply decrease in film thickness with a decrease in DC power after elapse of a specific point of DC power value of about 5.5 W/cm$^2$. This suggests that Ti diffusion increases with an increase in DC power. Specifically setting the sputter DC power at or less than about 5.5 W/cm$^2$ in this way makes it possible to likewise increase the diffuseability of Ti, thus facilitating fabrication of the reaction layer 20.

Figure 10:
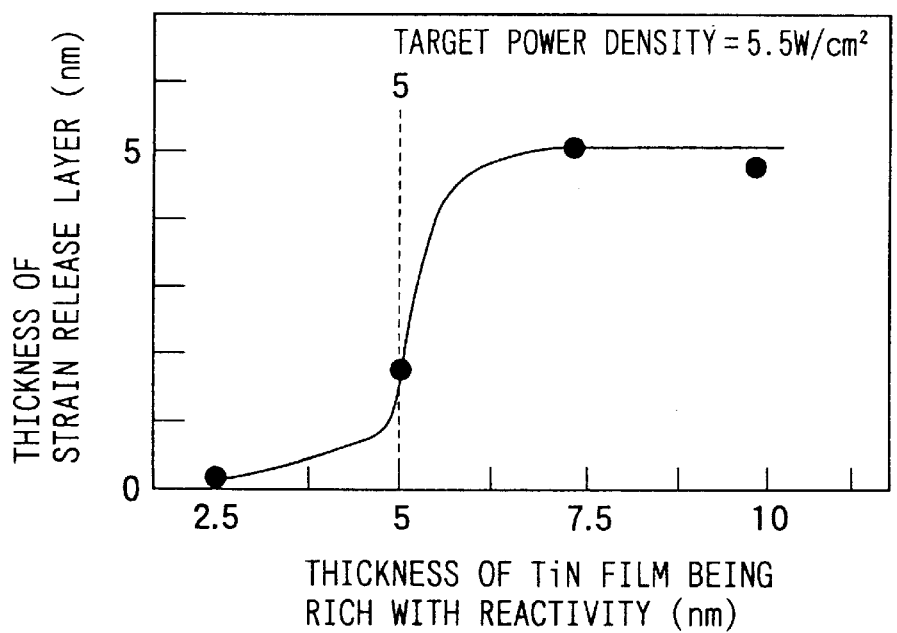
FIG. 10 is a graph showing a relation of a thickness of the reactivity-rich TiN film 13$d$ versus a thickness of the reactive layer 20.

See also FIG. 10, which indicates a relation of a film thickness of the reactivity-rich TiN film 13d versus the reaction layer 20's thickness. Data plotted herein are obtained with the DC power density being set at about 5.5 W/cm$^2$ during Ti-targeted sputtering. It is apparent from FIG. 10 that the reaction layer 20 varies in film thickness with a change in thickness of reactivity-rich TiN film 13d—especially, the reaction layer 20's thickness appreciably increases when the reactivity-rich TiN film 13d is more than 5 nm in thickness. This experimentation result makes sure that the setting of TiN film 13d's thickness at 5 nm or greater permits Ti to diffuse more deeply, which in turn makes it possible to effectively fabricate the intended reaction layer 20.

Figure 11:
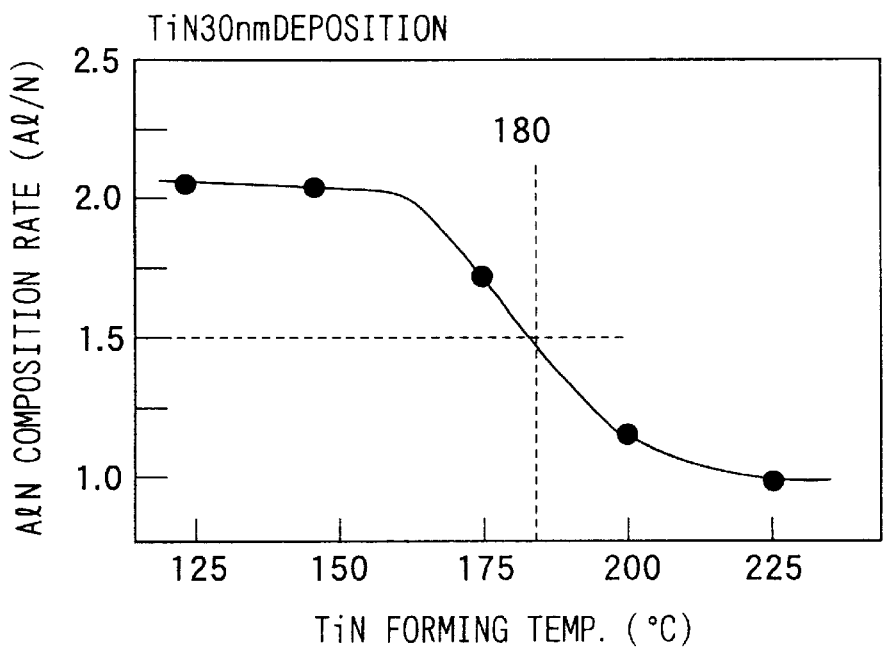
FIG 11 is a graph showing a relation of a film fabrication temperature of the TiN film 13$d$ and a composition ratio of an AlN film as formed at an interface between the TiN film 13$d$ and an Al—Cu film 13$c$.

See next FIG. 11, which experimentally demonstrates a relation of a film fabrication temperature of the TiN film 13d versus a composition ratio of AlN film as formed at an interface between TiN film 13d and Al—Cu film 13c. Additionally FIG. 12 is a graph showing a relation of the AlN composition ratio versus the EM lifetime, and FIG. 13 shows the average film thickness of an AlN film 13e as formed in case the AlN composition ratio is changed in value.

As apparent from FIG. 11, the AlN composition ratio increases with a decrease in TiN film 13d's film fabrication temperature. This inturn suggests that the lower the fabrication temperature of TiN film 13d, the lower the ratio of nitrogen (N) contained in aluminum (Al)—that is, the less the AlN film 13e formed within Al—Cu film 13c.

Figure 12:
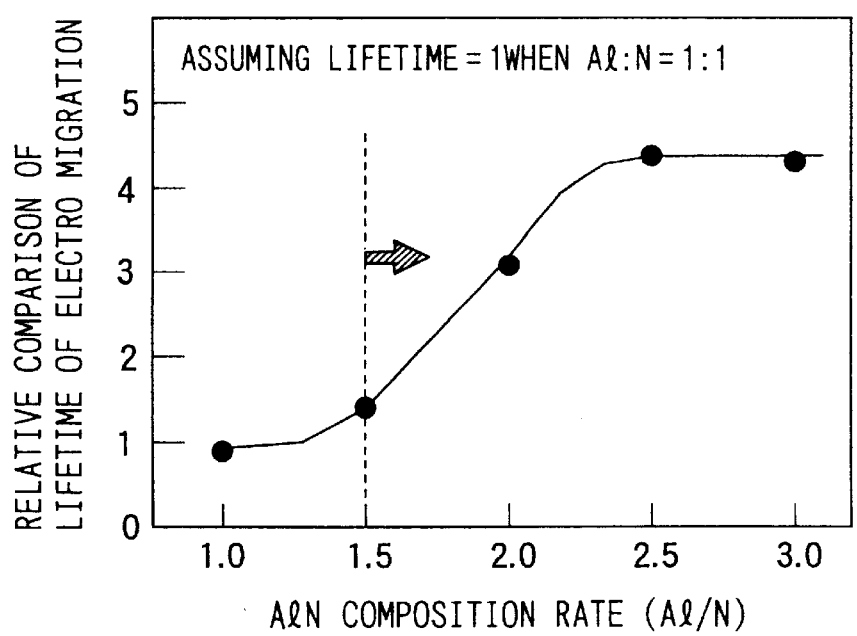
FIG 12 is a graph showing a relation of AlN composition ratio versus EM lifetime.
Figure 13:
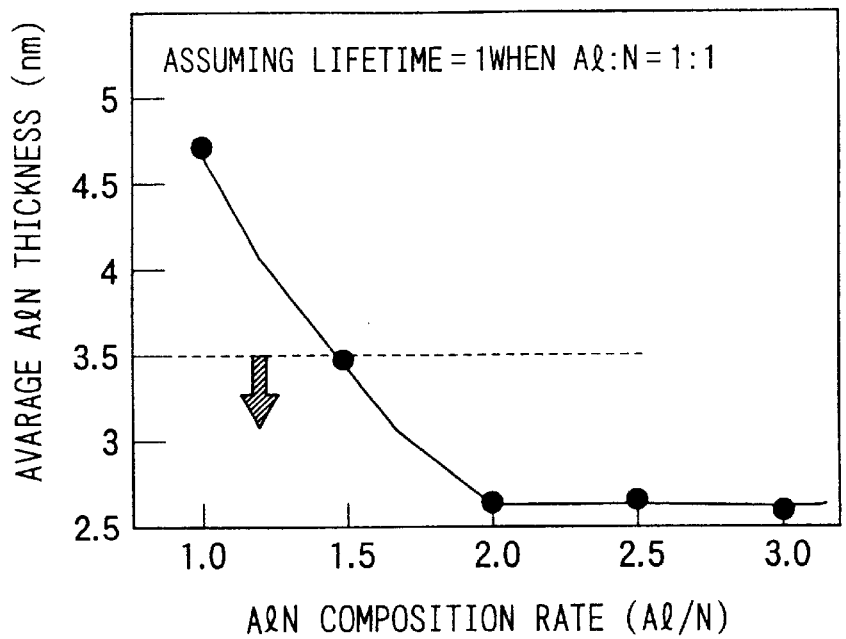
FIG 13 is a graph showing an average thickness of an AlN film 13$e$ fabricated in case the AlN composition ratio is change in value.

On the other hand, the graph of FIG. 12 shows that the resultant EM lifetime increases with an increase in AiN composition ratio. And FIG. 13 suggests that the greater the AiN composition ratio, the thinner the AiN film 13e. It has been found through experimentation that letting the AiN composition ratio measure 1.5 or more results in fabrication of an extra-thin AlN film with a thickness of 3.5 nm or less.

From the foregoing, it would be appreciated that fabrication of the reactivity-rich TiN film 13d at low temperatures less than or equal to 180° C. to thereby increase the AlN composition ratio results in a decrease in thickness of the AlN film 13e of FIG. 5A made of dielectric material, which in turn makes it possible to greatly suppress unwanted contact defects at via holes otherwise occurring due to the presence of such AlN dielectric film 13e while at the same time improving the EM lifetime.

Accordingly, specifically setting the process conditions during sputtering of the TiN film 13d in the way as taught by the embodiment of the instant invention may accelerate diffusion of Ti into Al—Cu film 13c to thereby facilitate fabrication of the reaction layer 20 while at the same time enabling the AlN film 13e to increase in composition ratio and yet decrease in resultant thickness, thus improving the EM lifetime.

Figure 14:
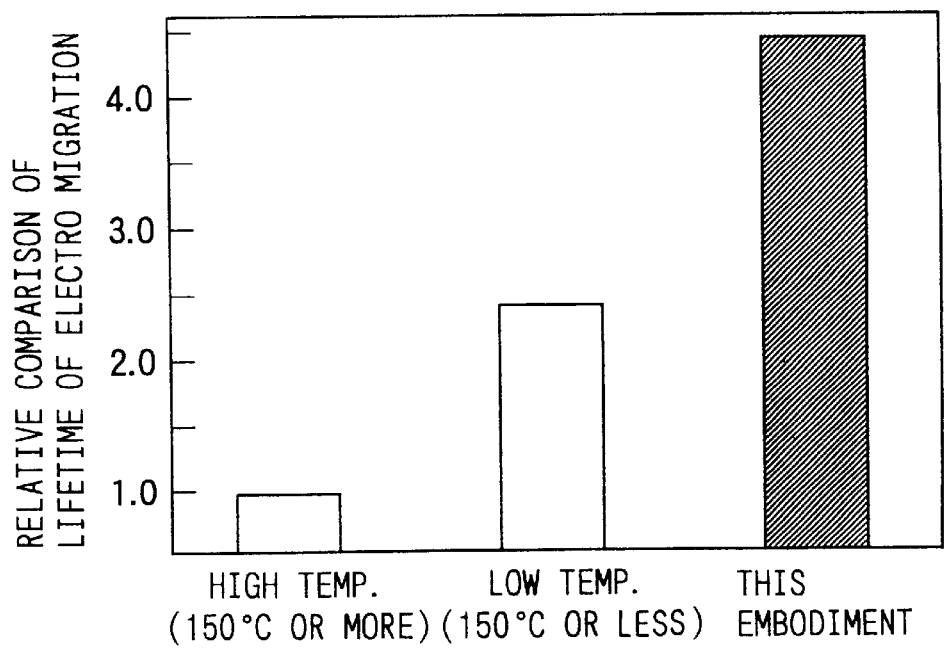
FIG. 14 is a graph showing the resultant EM lifetime in case electrical leads are formed by methodology embodying the invention in comparison with that of one typical related art.

For referencing purposes, one typical measurement value of the EM lifetime obtainable in case electrical lead wires were fabricated by the method embodying the invention is shown in FIG. 14, in comparison with those obtained in the related art. This graph shows on its right-hand side an EM life time value of the embodiment along with indication of an EM lifetime value, on the left-hand side, that was obtained in case a TiN film relatively high in barrier property was fabricated at high temperatures (in excess of 150° C.) and an EM lifetime, at central part of the graph, as obtained in case a TiN film with increased barrier property was formed at low temperatures (less than or equal to 150° C.). This experimental results well demonstrate that the use of the embodiment method makes it possible to improve the EM lifetime.

In this way discussed above, the intended multilayer structure is obtained including the Ti film 13a that is disposed beneath the Al—Cu film 13c and TiN film 13b and also the reactivity-rich TiN film 13d overlying the Al—Cu film 13c as better shown in FIG. 5A.

Figure 5B:
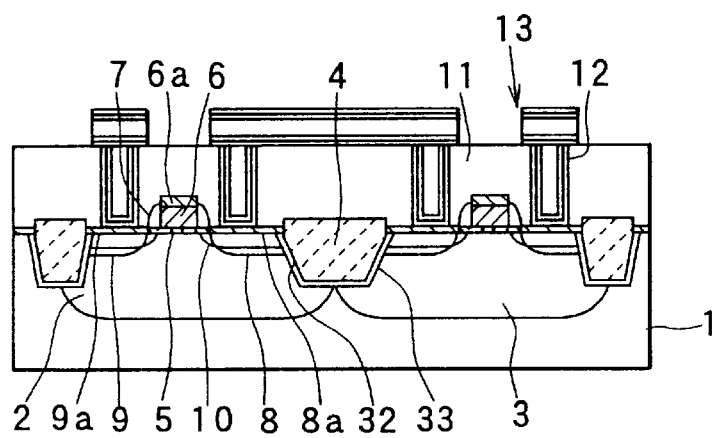

Step Shown in FIG. 5B

After completion of the process of FIG. 5A, the first Al-alloy wiring leads 12 are fabricated through photolithographical patterning process. To attain this lead patterning, a photoresist film is first deposited on the metal film; then, the photoresist film is patterned defining therein openings at selected portions other than those to be left as the first Al-alloy leads 12. Thereafter, etching is done with the patterned photoresist film being as a mask to thereby remove away metal leads at the openings of the photoresist film. Whereby, only metal film portions underlying the photoresist are left, resulting in fabrication of the first Al-alloy leads 12.

Figure 5C:
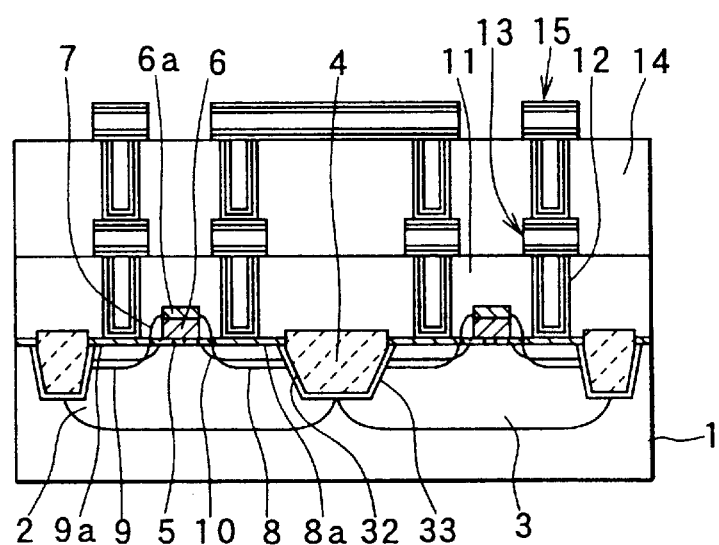

Step Shown in FIG. 5C

Through similar processes to the first-level Al-alloy lead pattern 13 shown in FIGS. 4C and 5A and 5B, a second-level pattern of Al-alloy leads 15 is formed on an ILD layer 14 which is between such leads 15 and underlying leads 13 as better shown in FIG. 1. Further, a pattern of third-level Al-alloy leads 17 is formed with an ILD film 16 laid between the second and third lead patterns 15, 17 (see FIG. 1).

Thereafter, a lamination of protective films 18, 19 is fabricated on the overall surface of the resultant wafer, thus completing the semiconductor device shown in FIG. 1.

One principal feature of the above-noted CMOS transistor device manufacturing method embodying the invention is that it includes the TiN film fabrication step which forms the reactivity-rich TiN film 13d to a predetermined thickness of more than or equal to 5 nm. Letting TiN film 13d measure 5 nm or above in thickness may permit the Al—Ti reaction layer 20 to increase in thickness, which in turn enables successful fabrication of any intended reaction layer that is deep enough to reach inside of its associated Al-alloy layer. This makes it possible to almost completely fill any residual holes defined within the Al-alloy layer.

Another principal feature of the embodiment method is that reactivity-rich TiN film 13d is formed through sputtering at relatively low temperatures of about 180° C. or below. With such low-temperature sputtering feature, it becomes possible to avoid or at least greatly suppress creation of an AlN layer at the interface between the Al-alloy layer and TiN film.

Second Embodiment

An explanation will now be given of a CMOS transistor device manufacturing method in accordance with another embodiment of the invention. This second embodiment is similar in process to the first embodiment shown in FIGS. 1–5C, except that creation of the AlN film 13e of FIG. 5A is suppressed or minimized in a different way. More specifically, while the first embodiment method is arranged to suppress such AlN film formation by means of specific setup of sputtering process parameters, including the DC power and sputtering temperature, the second embodiment is such that the same results are attainable by employing a unique approach as will be set forth in detail below.

It has been stated that the principal approach in the related art to forming the TiN film 13d is to employ sputter techniques using a $N_2$ and Ar mixture gas. This approach does not come without accompanying a penalty—the $N_2$ gas used often permits creation of nitrogen radicals, which badly behave to form an AlN film 13e on the Al—Cu film 13c as shown in FIG. 5A.

Figure 15B:
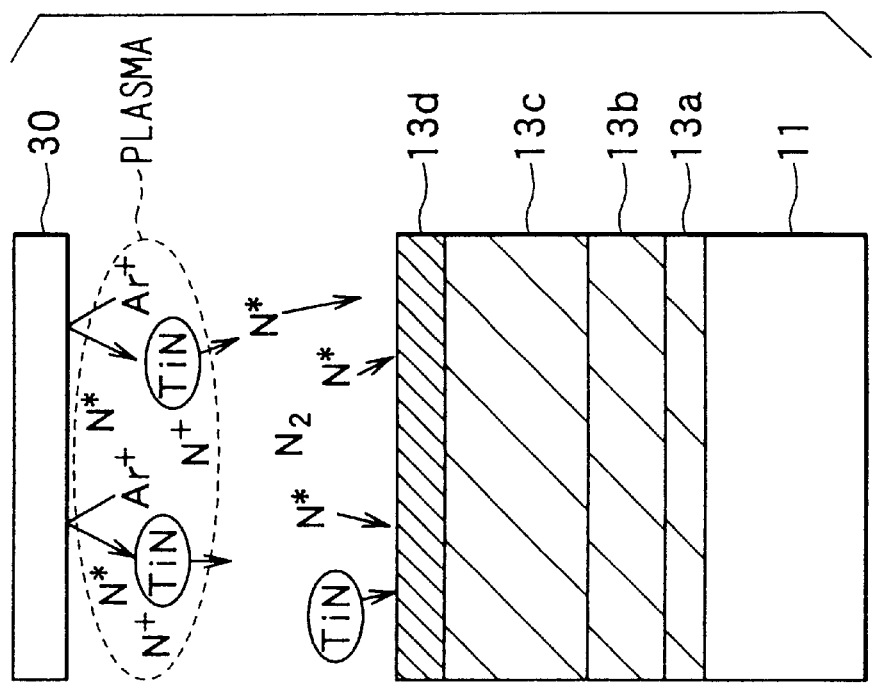
FIGS 15A and 15B are diagrams each showing a pictorial representation of sputtering treatment in accordance with a second embodiment of the present invention.
Figure 15A:
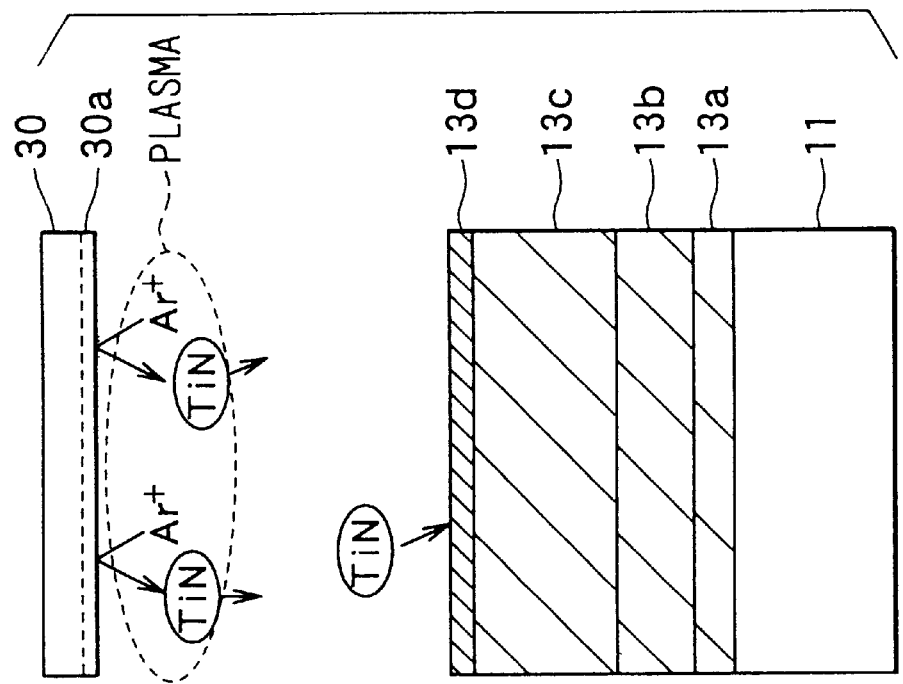
Figure 16:
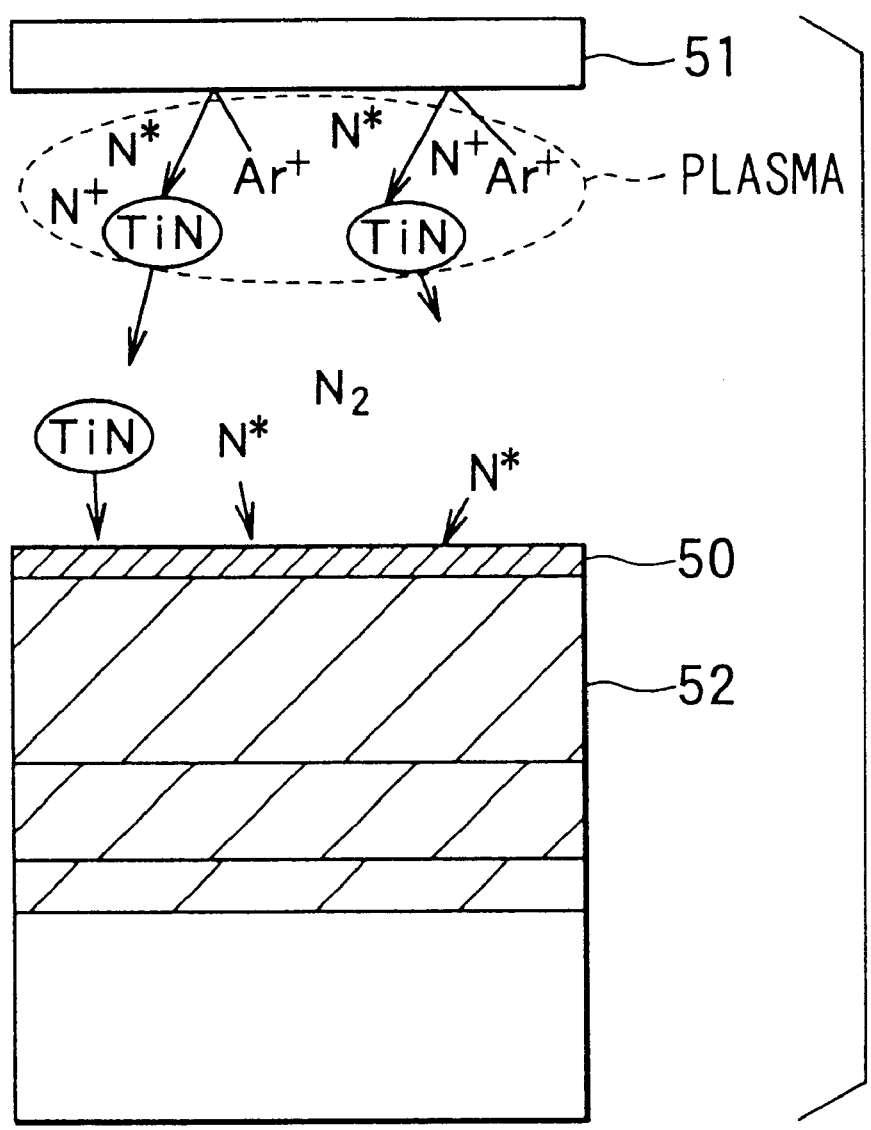
FIG. 16 is a pictorial representation of sputtering treatment.

On the contrary, the second embodiment is designed so that as shown in FIGS. 15A and 15B, sputtering is done with no $N_2$ gases during fabrication of the TiN film 13d and, thereafter, sputtering with a $N_2$ gas introduced will be effectuated. Specifically this embodiment employs a technique which follows.

At the process step of forming the reactivity-rich TiN film 13d, sputtering is carried out in an atmosphere with $N_2$ gas introduced thereinto. This would result in fabrication of a TiN layer 30a on the surface of a Ti layer 30 for use as a sputter target due to chemical reaction with nitrogen radicals in the $N_2$ gas atmosphere during sputtering as shown in FIG. 15A. Effectuation of sputtering treatment with this TiN layer 30a being as the target may lead to fabrication of the intended TiN film. In view of this fact, recurrent execution of sputter processes using the same Ti target 30 with TiN layer 30a formed through previous sputtering can often result in the TiN layer 30a at least partly removed away or "spin out" from the Ti target 30's surface at the beginning of sputtering, which in turn leads to fabrication of a TiN layer on the surface of Al—Cu film 13c without having to introducing any $N_2$ gases into the atmosphere. This precludes creation of nitrogen radicals otherwise occurring due to such $N_2$ in the sputtering atmosphere, thus enabling elimination of fabrication of AlN film 13e on Al—Cu film 13c.

After depletion of the entire TiN layer 30a on Ti target 30 through spin-out removal (or alternatively prior thereto), the sputtering is continued with $H_2$ gas introduced into the atmosphere as shown in FIG. 15B. In this way, the intended TiN film may be fabricated in the absence of any $N_2$ gas in the sputter atmosphere at the beginning of film fabrication process—thereafter, a TiN film is manufactured in the presence of $N_2$ gas introduced into the atmosphere.

Also note that repeated application of sputter processes using the same Ti target to a queue of wafers as conveyed on a production line in the manufacture of semiconductor devices results in fabrication of a TiN layer on such Ti target through previous sputtering process. Utilizing this layer while recurrently employing on the manufacturing line the process technique for preventing introduction of $N_2$ gases at the beginning of TiN film 13d fabrication step and thereafter permitting $N_2$ gas introduction makes it possible to preclude fabrication of AlN film 13e on Al—Cu film 13c without having to additionally employ any extra processes steps of forming TiN on the Ti target surface.

With such an arrangement, it becomes possible to prevent fabrication of any AlN film 13e at the interface between the Al—Cu film 13c and TiN film 13d. This makes it possible to avoid risks of electrical connection defects at via holes otherwise occurring due to the presence of such AlN film 13e, thereby enabling improvement in EM lifetime.

It should be noted that although in this embodiment the reaction layer 20 of Ti and Al due to Ti diffusion will hardly be formed unlike the first embodiment, this reaction layer is the one which is preferably be formed deeply in the segmented state if it were formed—if such reaction layer is not formed then it is possible to suppress Cu diffusion within the Al—Cu film 13c, which in turn makes it possible to greatly improve the EM lifetime. Note however that even when such Ti—AL reaction layer is formed, the EM lifetime improvement effect is still obtainable.

Other Possible Modifications

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

For example, although the second embodiment method shown in FIGS. 15A–15B is designed so that the sputtering is done while using the Ti target 30 with TiN 30a formed thereon only at the beginning of the process step of forming the TiN film 13d, the entirety of such TiN film 13d may alternatively be formed using the TiN target.

Note here that the first and second embodiment methods maybe combined together when the need arises so that the sputtering conditions for eliminating introduction of $N_2$ gases into the atmosphere as employed in the second embodiment may be replaced with those used in the first embodiment to thereby provide the intended reactivity-rich TiN film 13d.

Also note that the illustrative TiN barrier film 13b underlying the Al—Cu film 13c shown in FIG. 2 or FIG. 5A may also be replaced with the one with increased chemical reactivities where necessary. If this is the case, a likewise increase in Ti diffuseability is expectable, thus enabling successful embedding or fulfillment of any residual voids or holes within Al film materials. This in turn makes it possible to further segmentation of $TiAl_3$ material, resulting in a further increase in EM lifetime.

What is claimed is:

1. A semiconductor device comprising:
a semiconductor substrate;
a semiconductor element formed on the semiconductor substrate; and
an aluminum alloy wiring connected to the semiconductor element on the semiconductor substrate, the aluminum alloy wiring including:
an aluminum alloy layer containing metal which restricting a movement of aluminum; and
a TiN film formed on the aluminum alloy layer and being rich with reactively;
wherein AlN layer is formed at an interface between the aluminum alloy layer and the TiN film, the AlN layer has a composition ratio of Al is 1.5 or more when that of N is 1.

2. The semiconductor device according to claim 1, wherein the AlN layer has a thickness of 3.5 nm or less.

3. The semiconductor device according to claim 1, wherein the aluminum alloy wiring includes plural reacted layers that are formed into the aluminum alloy layer from the TiN film at an interface with the TiN film and that extend into the aluminum alloy layer deeper than the AlN layer, the reacted layers being divided from one another and dotted on the interface.

4. The semiconductor device according to claim 1, wherein entire TiN film is rich in reactivity in a perpendicular direction thereof.

5. The semiconductor device according to claim 1, wherein plural reacted layers are formed in the aluminum alloy layer at an interface with TiN film, the reacted layers are divided by each to be dotted with the interface.

6. The semiconductor device according to claim 5, wherein the reacted layers extend from the TiN film into the aluminum alloy layer.

7. A semiconductor device comprising:
an insulating layer covering an underlying structure, the insulating layer defining a vertical hole that exposes the underlying structure from a bottom of the vertical hole;
a metal layer disposed on the bottom and a sidewall of the vertical hole,
a tungsten plug filled in the vertical hole; and
wiring disposed on the insulating layer and connected to the tungsten plug, the wiring having a stacked-layer structure which comprises:
a titanium layer disposed on the insulating layer and connected to the tungsten plug;
a titanium nitride layer disposed on the titanium layer;
a cupriferous aluminum alloy layer disposed on the titanium nitride layer; and
an anti-reflective coating disposed on the cupriferous aluminum alloy layer, the anti-reflective coating including a titanium nitride layer which essentially consists of TiN crystal whose bonding state between nitrogen and titanium is controlled to be weak compared to a stoichiometrical TiN, wherein plural reacted islands including titanium and aluminum are formed in the cupriferous aluminum alloy layer at an interface with the anti-reflective coating so that each of the reacted layers is divided from one another, dotted on the interface and protruded into a perpendicular direction of the cupriferous aluminum alloy layer from the anti-reflective coating, and wherein the TiN crystal in the anti-reflective coating is TiN (111) and the reacted islands are $Al_3Ti$ (202).

8. A semiconductor device according to claim 7, wherein the comprises:
a titanium layer disposed on the bottom and the sidewall of the vertical hole and contacting the sidewall of the vertical hole; and
a titanium nitride layer disposed on the titanium layer and contacting the tungsten plug.

9. A semiconductor device according to claim 8, wherein the titanium nitride layer under the cupriferous aluminum alloy layer in the stacked-layer structure is controlled so that a bonding state thereof between nitrogen and titanium is weak compared to a stiochiometrical TiN.

10. A semiconductor device according to claim 9, wherein the wiring has plural reacted islands including titanium and aluminum disposed at each interface between the cupriferous aluminum alloy layer and the upper or lower titanium nitride layer to extend into the cupriferous aluminum alloy layer, the plural reacted islands being discontiguously positioned with respect to one another.

11. A semiconductor device comprising:
a semiconductor substrate;
a semiconductor element formed on the semiconductor substrate; and
an aluminum alloy wiring connected to the semiconductor element on the semiconductor substrate, the aluminum alloy wiring including:

an aluminum alloy layer containing metal restricting movement of aluminum;

a TiN film formed on the aluminum alloy layer;

an AlN layer formed at an interface between the aluminum alloy layer and the TiN film and having predetermined thickness; and plural reacted layers formed at the interface to extend into the aluminum alloy layer from the TiN film and to have a thickness greater than that of the AlN layer, the reacted layers being divided from one another and dotting the interface.

12. A semiconductor device comprising:

a semiconductor substrate;

a semiconductor element formed on the semiconductor substrate; and an aluminum alloy wiring connected to the semiconductor element on the semiconductor substrate, the aluminum alloy wiring including:

an aluminum alloy layer metal restricting movement of aluminum;

an anti-reflective coating consisting essentially of TiN (111) formed on the aluminum alloy layer; and plural reacted layers of $Al_3Ti$ (202) formed at an interface between the aluminum alloy layer and the anti-reflective coating so as to extend from the anti-reflective coating into the aluminum alloy layer, the reacted layers being separated from one another and dotting the interface.

* * * * *